(12) United States Patent
O'Brien et al.

(10) Patent No.: US 10,541,721 B2
(45) Date of Patent: Jan. 21, 2020

(54) MODULATION INDEX ADJUSTMENT

(71) Applicant: Analog Devices Global Unlimited Company, Hamilton (BM)

(72) Inventors: Michael W. O'Brien, Youghal (IE); Sudarshan Onkar, Bengaluru (IN)

(73) Assignee: Analog Devices Global Unlimited Company, Hamilton (BM)

( * ) Notice: Subject to any disclaimer, the term of this patent is extended or adjusted under 35 U.S.C. 154(b) by 150 days.

(21) Appl. No.: 15/716,197

(22) Filed: Sep. 26, 2017

(65) Prior Publication Data
US 2019/0097680 A1 Mar. 28, 2019

(51) Int. Cl.
| | |
|---|---|
| *H03C 3/09* | (2006.01) |
| *H04B 10/556* | (2013.01) |
| *H04L 27/12* | (2006.01) |
| *H04B 1/7156* | (2011.01) |
| *H04L 27/34* | (2006.01) |
| *H04L 1/00* | (2006.01) |
| *H04L 27/20* | (2006.01) |
| *H04J 13/00* | (2011.01) |

(52) U.S. Cl.
CPC ......... *H04B 1/7156* (2013.01); *H03C 3/0925* (2013.01); *H03C 3/0941* (2013.01); *H03C 3/0958* (2013.01); *H04B 10/5563* (2013.01); *H04L 1/0057* (2013.01); *H04L 27/12* (2013.01); *H04L 27/201* (2013.01); *H04L 27/3411* (2013.01); *H04J 13/0003* (2013.01); *H04L 2001/0093* (2013.01)

(58) Field of Classification Search
CPC ... H03C 3/00; H03C 3/02; H03C 3/06; H03C 3/09; H03C 3/0908; H03C 3/0925; H03C 3/0933; H03C 3/0941; H03C 3/0958; H03C 3/0991; H03D 3/00; H04B 10/556; H04B 10/5563; H04B 10/612; H04L 1/0057; H04L 2001/0093; H04L 27/10; H04L 27/106; H04L 27/12; H04L 27/14; H04L 27/1563
USPC ................................. 329/300; 332/100, 128
See application file for complete search history.

(56) References Cited

U.S. PATENT DOCUMENTS

| | | | |
|---|---|---|---|
| 5,121,412 A | | 6/1992 | Broth |
| 5,272,446 A | * | 12/1993 | Chalmers ............. G01R 23/165 329/304 |
| 5,832,022 A | | 11/1998 | Scott |
| 6,008,703 A | * | 12/1999 | Perrott ................. H03C 3/0925 331/16 |

(Continued)

FOREIGN PATENT DOCUMENTS

EP          0377180          7/1990

OTHER PUBLICATIONS

European Search Report for Application No. 18196109.5, dated Feb. 14, 2019 by European Patent Office, in 7 pages.

*Primary Examiner* — Levi Gannon
(74) *Attorney, Agent, or Firm* — Knobbe, Martens, Olson & Bear, LLP (57) ABSTRACT

Aspects of this disclosure relate to transmitting and/or receiving a frequency-shift keying signal including a packet that includes a preamble and a payload. The preamble has a first modulation index that has a smaller magnitude than a second modulation index of the payload. This can enhance frequency correction in a receive device that receives the packet.

20 Claims, 7 Drawing Sheets

(56) References Cited

U.S. PATENT DOCUMENTS

| | | | |
|---|---|---|---|
| 6,392,499 B1* | 5/2002 | Sato | H04L 27/12 |
| | | | 332/100 |
| 7,292,107 B2* | 11/2007 | Hsiao | H03C 3/0925 |
| | | | 327/156 |
| 7,385,929 B1* | 6/2008 | McFarland | H04L 1/0045 |
| | | | 370/243 |
| 8,761,230 B2* | 6/2014 | Lakkis | H04J 13/0014 |
| | | | 375/130 |
| 2004/0001447 A1 | 1/2004 | Schafer | |
| 2004/0001448 A1 | 1/2004 | Preston et al. | |
| 2005/0141636 A1* | 6/2005 | Minami | H03C 3/0958 |
| | | | 375/295 |
| 2005/0207474 A1 | 9/2005 | Voglewede | |
| 2005/0249312 A1* | 11/2005 | Bode | H04L 27/0008 |
| | | | 375/308 |
| 2010/0309959 A1* | 12/2010 | Lakkis | H04J 13/16 |
| | | | 375/150 |
| 2016/0308700 A1 | 10/2016 | Vijayasankar et al. | |
| 2016/0373279 A1 | 12/2016 | Lopez et al. | |

* cited by examiner

MODULATION INDEX ADJUSTMENT

FIELD OF DISCLOSURE

Embodiments of the present disclosure relate to communications and, in particular, to data communication that involves frequency-shift keying.

BACKGROUND

In frequency-shift keying (FSK) systems, digital information can be modulated by dynamically adjusting frequency of carrier. Gaussian frequency-shift keying (GFSK) is an example method of FSK. A receive device can receive an FSK signal and perform frequency correction using a preamble of a packet of the FSK signal. This can remove a frequency error, such as a frequency offset.

A direct current (DC) offset in the frequency demodulated receive signal path of the receive device can indicate the frequency error. Frequency error can be measured while processing the preamble in which a frequency pattern is deterministic. For a specified period of time, such as a few symbols, the average frequency can be measured. Then a frequency adjustment can be made. Such frequency correction can reduce and/or eliminate frequency error in a receive signal path. However, frequency correction associated with an FSK signal in a receive device can be difficult to accurately implement with various approaches when a relatively large frequency error exists.

SUMMARY OF THE DISCLOSURE

The innovations described in the claims each have several aspects, no single one of which is solely responsible for its desirable attributes. Without limiting the scope of the claims, some prominent features of this disclosure will now be briefly described.

One aspect of this disclosure is a communication device with frequency-shift keying. The communication device comprises a modulation circuit and a frequency synthesizer. The modulation circuit is configured to modulate a digital input signal. The frequency synthesizer is configured to receive an output of the modulation circuit and to output a frequency-shift keying signal comprising a packet. The packet comprises a preamble and an other portion. The modulation circuit is configured to adjust modulation to cause the preamble to have a first modulation index and the other portion to have a second modulation index. The second modulation index has a greater magnitude than the first modulation index.

The modulation circuit can include a multiplier configured to adjust modulation of the digital input signal. The modulation circuit can also include a finite state machine configured to control the multiplier.

The first modulation index and the second modulation index can have the same sign. The first modulation index can be independent of information being transmitted by the packet.

The frequency synthesizer can include a phase-locked loop that includes a divider, in which the divider is configured to receive the output of the modulation circuit. A sigma delta modulator can be coupled between the modulation circuit and the divider.

The frequency synthesizer can include a phase locked loop that includes a controllable oscillator, in which the controllable oscillator is configured to receive the output of the modulation circuit. A digital-to-analog converter can be coupled between the modulation circuit and the controllable oscillator. The controllable oscillator can be a voltage-controlled oscillator.

The communication device can include a power amplifier configured to amplify the frequency-shift keying signal. The communication device can include a receiver that comprises a frequency correction circuit configured to perform frequency correction based on a preamble of a received packet received by the communication device.

Another aspect of this disclosure is a method of transmitting a packet using frequency-shift keying. The method includes generating a preamble of a packet such that the preamble has a first modulation index, wherein the packet is modulated with frequency-shift keying; generating a payload of the packet such that the payload has a second modulation index, wherein the second modulation index has a greater magnitude than the first modulation index; and transmitting the packet.

The method can include adjusting modulation index for the packet, using a multiplier, from the first modulation index to the second modulation index. The first modulation index and the second modulation index can both be independent of the information being transmitted by the packet. The packet can be modulated with Gaussian frequency-shift keying.

Another aspect of this disclosure is a method of processing a frequency-shift keying signal. The method includes receiving, by a receive signal path, a frequency-shift keying signal comprising a packet that comprises a preamble and a payload, wherein the preamble has a first modulation index that has a smaller magnitude than a second modulation index of the payload; performing frequency correction based on an output of a channelization filter associated with the preamble that has the first modulation index, wherein the channelization filter is in the receive signal path; and subsequent to said performing frequency correction, demodulating the payload that has the second modulation index.

The method can include measuring frequency error based on an output of a circuit that has an input coupled to the output of the channelization filter, in which performing frequency correction is based on measuring frequency error. The channelization filter can have a passband associated with the second modulation index. In some instances, modulation index information is used in performing frequency correction. The first modulation index can be independent of information being transmitted by the packet.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

DETAILED DESCRIPTION

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. The headings provided herein are for convenience only and do not necessarily affect the scope or meaning of the claims.

In Gaussian frequency-shift keying (GFSK) systems, frequency correction can be performed in a receive device during processing of a preamble of a packet. When there is a relatively large frequency error, the preamble of the packet can be filtered by a receiver such that frequency measurement accuracy can be compromised. Aspects of this disclosure relate to changing a protocol so that a modulation index (MI) has a smaller magnitude for the preamble of a packet relative to other parts of the packet, such as a payload of the packet. This adjustment of the modulation index can ensure that an entire signal is within a passband of a channelization filter of the receiver of a receive device. Accordingly, frequency adjustment in the receiver can be performed on an accurately measured frequency.

A transmit device can adjust a modulation index of a frequency-shift keying (FSK) signal such that a preamble of a packet has a modulation index with a smaller magnitude than a modulation index for an other portion of the packet. The other portion of the packet can be the remainder of the packet. The modulation index represents an amount by which a modulated variable varies around an unmodulated level. With a modulation index having a smaller magnitude for the preamble, more of the FSK signal received by a receive device can be within a passband of a channelization filter of the receive device in the presence of a relatively large frequency offset. Frequency correction can be performed during processing of the preamble. After frequency correction is performed, the remainder of the packet having a relatively larger magnitude modulation index can be processed by the receiver. As such, after frequency correction has been completed and the receiver is processing the other portion (e.g., the remainder) of the packet, the modulation index can have an intended value for a particular application.

Accordingly, a communications protocol can involve adjusting modulation index such that modulation index is reduced for a preamble relative to the remainder of the packet, for example, the payload. This can have the impact of reducing the frequency deviation of the preamble to the point where the FSK signal can reside entirely in-band in a channelization filter in a receiver even in the presence of a relatively large frequency offset.

Modulation index adjustment discussed herein can improve robustness of a communications system, such as improving robustness of calibration of a receive device. With the modulation index adjustment discussed herein, a modulation index of a preamble of a packet can be independent of information being transmitted by the packet. For instance, the modulation index of the preamble can have a value that does not encode any information being transmitted by the packet. Accordingly, a receive device that receives the packet can process the packet without any modulation index information in certain applications. This can enable a transmit device in accordance with the principles and advantages discussed herein to communication with a variety of receive devices. All control information of the packet can be included outside of the preamble. For example, data rate information can be included in the packet outside of the preamble. A modulation index of the remainder of the packet can also be of information being transmitted by the packet.

The modulation index of the preamble can have a smaller magnitude than the modulation index of an other portion of the packet, which can be some or all of the remainder of the packet. The other portion of the packet can be a payload or a payload together with one or more additional fields. The modulation index for the preamble of a packet can have the same sign as the modulation index for the other portion of the packet (i.e., both modulation indexes can be positive or both modulation indexes can be negative). A first modulation index of the preamble can have a magnitude that is within approximately 50% of a magnitude of a second modulation index of a payload. In some of instances, the first modulation index of the preamble can have a magnitude that is within approximately 25% of a magnitude of a second modulation index of a payload. For example, in certain instances, the second modulation index can be 0.5 and the first modulation index can be 0.4. As another example, the second modulation index can be 0.5 and the first modulation index can be 0.3 in certain applications. The first modulation index of the preamble can have a substantially constant value throughout substantially all of the preamble. The second modulation index of the other portion of the packet can have a substantially constant value throughout substantially the other portion of the packet.

Advantages of the communications protocol discussed herein can include one or more of the following advantages, among other. The channelization filter of the receiver can avoid filtering an in-band signal during an automatic frequency control (AFC) measurement. This can be achieved without reducing blocker selectivity. Other preamble related activities, such as signal-detect and automatic gain control (AGC), can be unaffected. Such other preamble related activities can be unaffected by frequency measurements and can be based on other measurements, such as power measurements. Fixed-point restrictions on the output of an arctangent (ATAN) block that adjusts I and Q signals to frequency can be alleviated. For example, for relatively extreme frequency offsets, there is a possibility that the ATAN block can introduce digital wraparounds, which would compromise the AFC measurement accuracy. The receiver may not need to be tuned differently if the MI value changes. In some instances, the receiver can be function properly without any changes related to adjusting the MI during the preamble. The receiver can be backwards compatible to existing technology. Modifications to the transmitter on the pairing device can be relatively straightforward.

Figure 1:
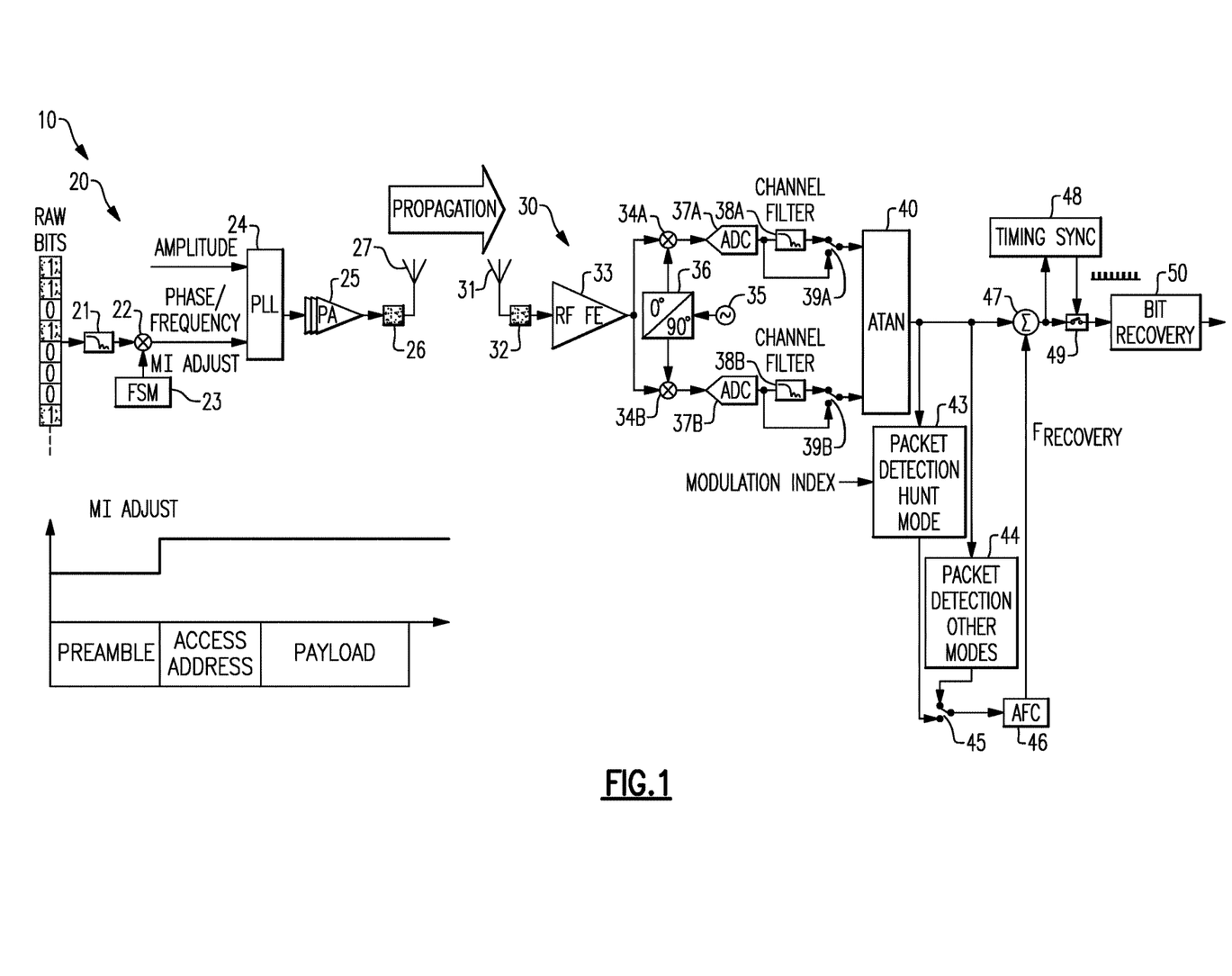
FIG. 1 is a schematic diagram of a communications systems that includes a transmit device paired with a receive device according to an embodiment.

FIG. 1 is a schematic diagram of a communications systems 10 that includes a transmit device 20 paired with a receive device 30 according to an embodiment. The transmit device 20 can wirelessly transmit an FSK signal to the receive device 30. The receive device 30 can process the FSK signal. The transmit device 20 and the receive device 30 are both communications devices. In some instances, the transmit device 20 can include additional circuitry (not illustrated in FIG. 1) to perform receive functionality in accordance with any suitable principles and advantages discussed herein. Similarly, in some instances, the receive device 30 can include additional circuitry (not illustrated in FIG. 1) to perform transmit features in accordance with any suitable principles and advantages discussed herein.

In the communications system 10, the transmit device 20 can generate an FSK signal that includes a packet commencing with a preamble. FSK includes a variety of frequency modulation protocols including, for example, GFSK, continuous phase frequency-shift keying (CPFSK), and minimum frequency-shift keying (MSK). The FSK signal has a modulation index. The modulation index represents an amount by which a modulated variable varies around an unmodulated level. In an FSK signal, the modulation index can represent a peak frequency deviation divided by a highest frequency component of a modulating signal, for example.

The transmit device 20 can control the modulation index of the FSK signal. For instance, a multiplier controlled by a state machine can give a different modulation index for a preamble of a packet versus for a remainder of the packet. The receive device 30 can receive the FSK signal and demodulate it to an instantaneous frequency signal. For certain modes of operation (e.g., hunt mode in the illustrated diagram), the receive device 30 can be provided with modulation index information during the preamble to assist with operation of the initial sub-systems, such as AFC. For a number of other modes of operation, the receiver can operate autonomously to the modulation index of the FSK signal.

The transmit device 20 can control the modulation index of the packet so that the modulation index has a smaller magnitude for the preamble than for the remainder of the packet. As illustrated, the transmit device 20 includes a Gaussian filter 21, a multiplier 22, a finite state machine 23, a phase-locked loop (PLL) 24, a power amplifier 25, an integrated circuit contact 26, and an antenna 27.

A digital input signal that that includes a bit stream can be modulated by a modulation circuit. The modulation circuit can operate in a digital domain. In such instances, the modulation circuit can be referred to as a digital modulation circuit. The modulation circuit of illustrated transmit device 20 includes the Gaussian filter 21, the multiplier 22, and the finite state machine 23. The Gaussian filter 21 can filter pulses of the bit stream to make transitions smoother. The multiplier 22 can multiply the output of the Gaussian filter 21 by a modulation index adjust signal MI Adjust provided by the finite state machine 23. The multiplier 22 can be any circuit that can perform a suitable multiplication operation. The multiplier 22 can be implemented by digital circuits in certain applications. The finite state machine 23 can control the modulation index adjust signal MI Adjust so that an FSK signal generated by the transmitter has a smaller magnitude modulation index for a preamble of a packet than for the rest of the packet. The rest of the packet can include an access address field and a payload as illustrated. In some other instances, the rest of the packet can include one or more additional fields and/or a subset of the illustrated fields.

A frequency synthesizer can receive an output of the modulation circuit and output an FSK signal that includes a packet, which contains a preamble for the earlier portion of the packet. The modulation circuit adjusting modulation can cause the preamble to have a first modulation index and a payload of the packet to have a second modulation index, in which the first second modulation index has a greater magnitude than the first modulation index. In the illustrated transmit device 20, the frequency synthesizer is the PLL 24. The PLL 24 receives an output of the modulation circuit, which can adjust phase and/or frequency of an output of the PLL. As illustrated, the PLL 24 can also receive an amplitude signal that controls an amplitude of the output of the PLL 24.

The FSK signal from the PLL 24 can be amplified by the power amplifier 25. The illustrated power amplifier 25 has an output connected to the integrated circuit contact 26. The integrated circuit contact 26 is connected to an antenna 27, which is implemented external to an integrated circuit that includes the modulation circuit, PLL 24, and power amplifier 25 in the illustrated transmit device 20. The antenna 27 transmits the FSK signal to the receive device 30.

As illustrated, the receive device 30 includes an antenna 31, an integrated circuit contact 32, a radio frequency front end (RF FE) 33, mixers 34A and 34B, local oscillator 35, IQ quadrature generation circuit 36, analog-to-digital converters (ADCs) 37A and 37B, channelization filters 38A and 38B, switches 39A and 39B, ATAN block 40, a first packet detection circuit 43, and second packet detection circuit 44, switch 45, AFC circuit 46, summer 47, timing synchronization circuit 48, switch 49, and bit recovery circuit 50.

The antenna 31 can receive the FSK signal from the transmit device 20. The antenna 31 is implemented external to an integrated circuit that includes the other illustrated circuitry of the receiver. The antenna 31 is connected to the RF FE 33 by way of the integrated circuit contact 32. The RF FE 33 can process the FSK signal. For instance, the RF FE 33 can include a low noise amplifier and one or more filters.

An output of the RF FE 33 can be down converted by mixers 34A and 34B. The IQ quadrature generation circuit 36 can receive an output of the local oscillator 35 and provide signals to the mixers 34A and 34B so as to generate an in-phase signal (I signal) and a quadrature signal (Q signal) that is 90° out of phase with the I signal. The down converted outputs of the mixers 34A and 34B, respectively, can be converted to digital signals by ADCs 37A and 37B, respectively. Channelization filters 38A and 37B can filter the outputs of ADCs 37A and 37B, respectively. Switches 39A and 39B can selectively pass either an input or an output of the channelization filters 38A and 38B, respectively, to the ATAN block 40. The ATAN block 40 can perform an ATAN function. The ATAN block 40 can convert processed I and Q signals to a frequency. Any suitable circuit that convert I and Q signals to a frequency can be implemented in place of the ATAN block 40.

A packet can be detected by a first packet detection circuit 43 and/or a second packet detection circuit 44. The first packet detection circuit 43 can use modulation index information to identify the packet. For example, the first packet detection circuit can be a hunt mode packet detection circuit. In hunt mode, packet detection can involve using modulation index information. The second packet detection circuit 44 can detect a packet without using modulation index information. The second packet detection circuit 44 can detect a packet in modes other than hunt mode, such as during typical operation. A switch 45 can selectively electrically connect the first packet detection circuit 43 or the second packet detection circuit 44 to the AFC circuit 46 based on a mode of operation of the receiver.

The AFC circuit 46 can detect a frequency based on an instantaneous frequency contained in the preamble. The AFC circuit 46 can include a state machine. The AFC circuit 46 can generate frequency correction information Frecovery. The summer 47 can adjust an output of the ATAN block 40 by the frequency correction information Frecovery to correct for a frequency offset in the FSK signal received by the receive device 30. For instance, the summer 47 can subtract a frequency correction value from the output of the ATAN block 40. The summer 47 is an example of a correction circuit that can perform any suitable frequency correction operation, such as addition, subtract, the like, or any suitable combination thereof. The frequency correction information Frecovery can be determined while a preamble is being processed. The frequency correction information Frecovery can be set for the duration of the remainder of the packet.

A frequency corrected signal provided by the summer 47 can be further processed. A timing synchronization circuit 78 can control a switch 49 that provides the frequency corrected signal to a bit recovery circuit 50 that generates bits corresponding to the FSK signal received from the transmit device 20.

Accordingly, in the communications system 10, the transmit device 20 can transmit a packet using frequency-shift keying. The transmit device 20 can generate a preamble of the packet such that the preamble has a first modulation index, in which the packet is modulated with frequency-shift keying. The transmit device 20 can generate the remaining portion of the packet containing a second modulation index, in which the second modulation index has a greater magnitude than the first modulation index. The transmit device 20 can transmit the packet to the receive device 30. The receive device 30 can process the packet. A receive signal path of the receive device 30 can perform frequency correction based on an output of a channelization filter, in which the output is associated with the preamble. Then the receive signal path can demodulate the remainder of the packet, which has a modulation index with a greater magnitude than the modulation index of the preamble.

Figure 2:
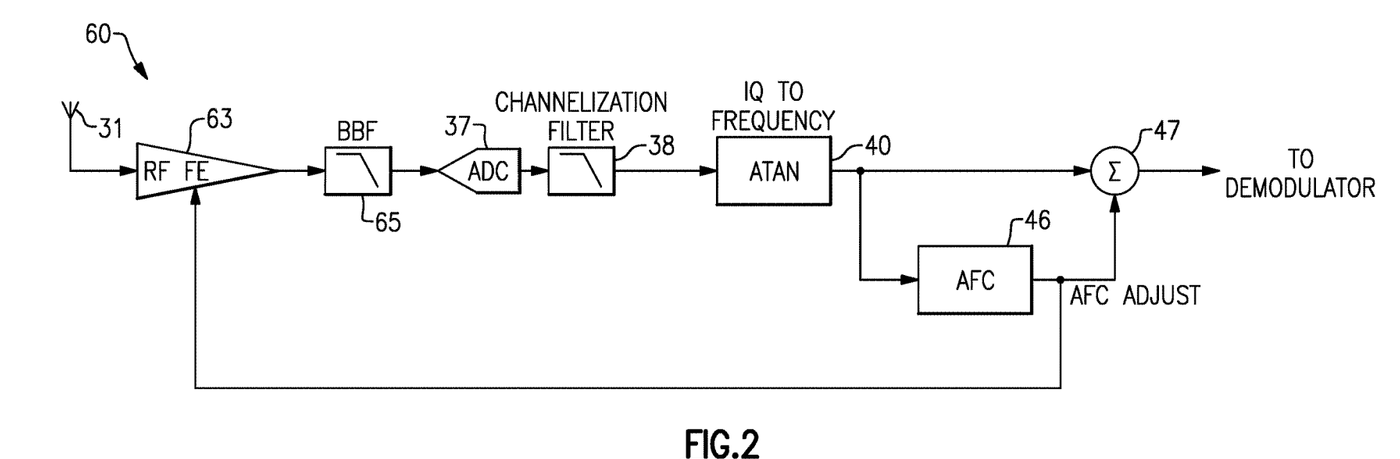
FIG. 2 is a schematic diagram of a receive device in accordance with an embodiment.

FIG. 2 is a schematic diagram of a receive device 60 according to an embodiment. The receive device 60 is similar to the receive device 30 of FIG. 1. Any suitable principles and advantages of these receive devices can be implemented in accordance with the modulation index adjustment disclosed herein. In the receiver 60, an RF FE 63 can down convert an FSK signal received by an antenna 31 to baseband. A baseband filter 65 can filter an output of the RF FE 63. The ADC 37 can convert the output of the baseband filter 65 to a digital signal. The channelization filter 38 can filter an output of the ADC 37. The output of the channelization filter 38 is connected to the ATAN block 40. While only one signal path from the RF FE 63 to the ATAN block 40 is shown in FIG. 2, an I path and a Q path can be included between the RF FE 63 and the ATAN block 40.

The receive device 60 includes a receiver with automatic frequency correction (AFC). In this receiver, frequency error can manifest itself as a direct current (DC) offset at the output of the ATAN block 40. Frequency error can be measured during preamble where the frequency pattern is deterministic. The AFC circuit 46 can measure the frequency error. For a specified period (e.g., a few symbols), the average frequency can be measured. A single-shot adjustment can then be made. The AFC circuit 46 can output an AFC offset adjustment value. The summer 47 can adjust the output of the ATAN block 40 by the AFC offset adjustment value to reduce and/or eliminate the frequency error. The summer 47 can add and/or subtract an output of the AFC circuit 46 to/from the output of the ATAN block. The AFC offset adjustment value can be constant while the rest of the packet other than the preamble is being processed. The output of the summer 47 can then be demodulated into bits.

The channelization filter 38 can offer a relatively tight selectivity around a wanted channel bandwidth. However, if a large frequency error exists, then the preamble, from which the AFC offset adjustment value is derived, can be significantly filtered. In certain cases, this can lead to a relatively poor AFC detection and correction. Consequently, throughput can be degraded.

Figure 3A:
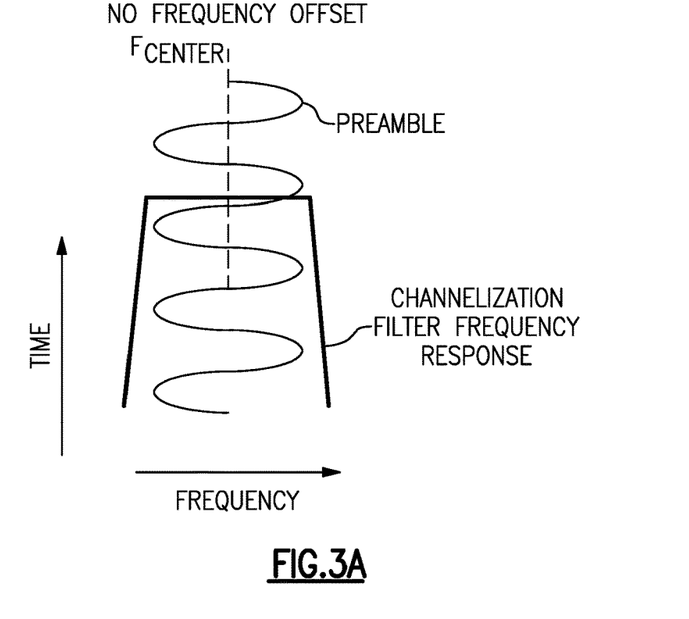
FIG. 3A is a graph of a frequency-shift keying signal with no frequency offset and a frequency response of a channelization filter of a receive device.
Figure 3B:
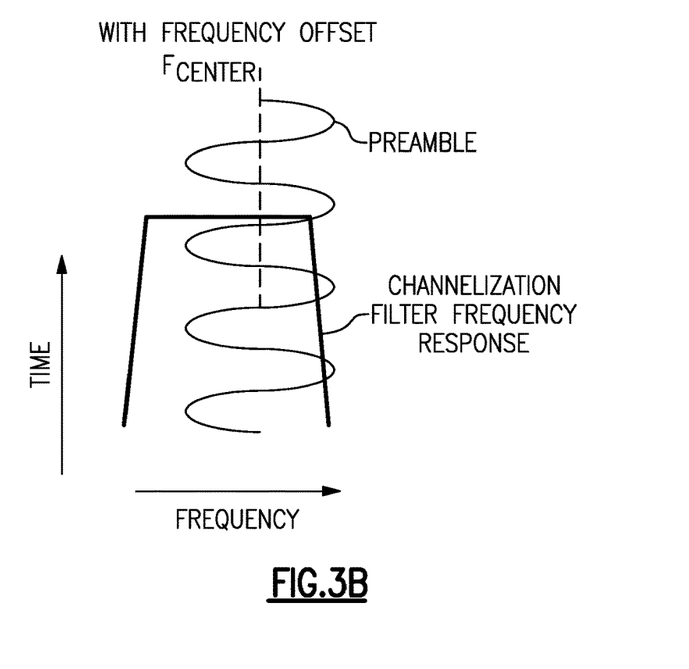
FIG. 3B is a graph of a frequency-shift keying signal with frequency offset and a frequency response of a channelization filter of a receive device.

FIG. 3A is a graph of a frequency-shift keying signal with no frequency offset and a frequency response of the channelization filter 38 of the receive device 60. In contrast, FIG. 3B is a graph of a frequency-shift keying signal with frequency offset and the frequency response of the channelization filter 38. These figures illustrate the frequency of a preamble versus time with no frequency offset and with a frequency offset that can result in part of the preamble being filtered by the channelization filter 38. When part of the preamble is filtered out, data can be corrupted.

The modulation in the transmit device 20 discussed with reference to FIG. 1 can reduce the frequency deviation of the preamble such that the FSK signal can be entirely in-band. Accordingly, the preamble can be within the passband of the channelization filter 38 of FIG. 2 even in the presence of a relatively large frequency offset. This can result in accurate frequency correction even in the presence of a relatively large frequency offset. The receive device can tolerate a larger frequency error with the modulation index adjustment discussed herein while maintaining desired characteristics of the channelization filter 38. For instance, the channelization filter 38 can have a passband corresponding to a modulation index of a non-preamble portion of a packet. Accordingly, the parameters of the channelization filter 38 can be designed and/or optimized for processing the non-preamble portion of the packet.

Figure 4:
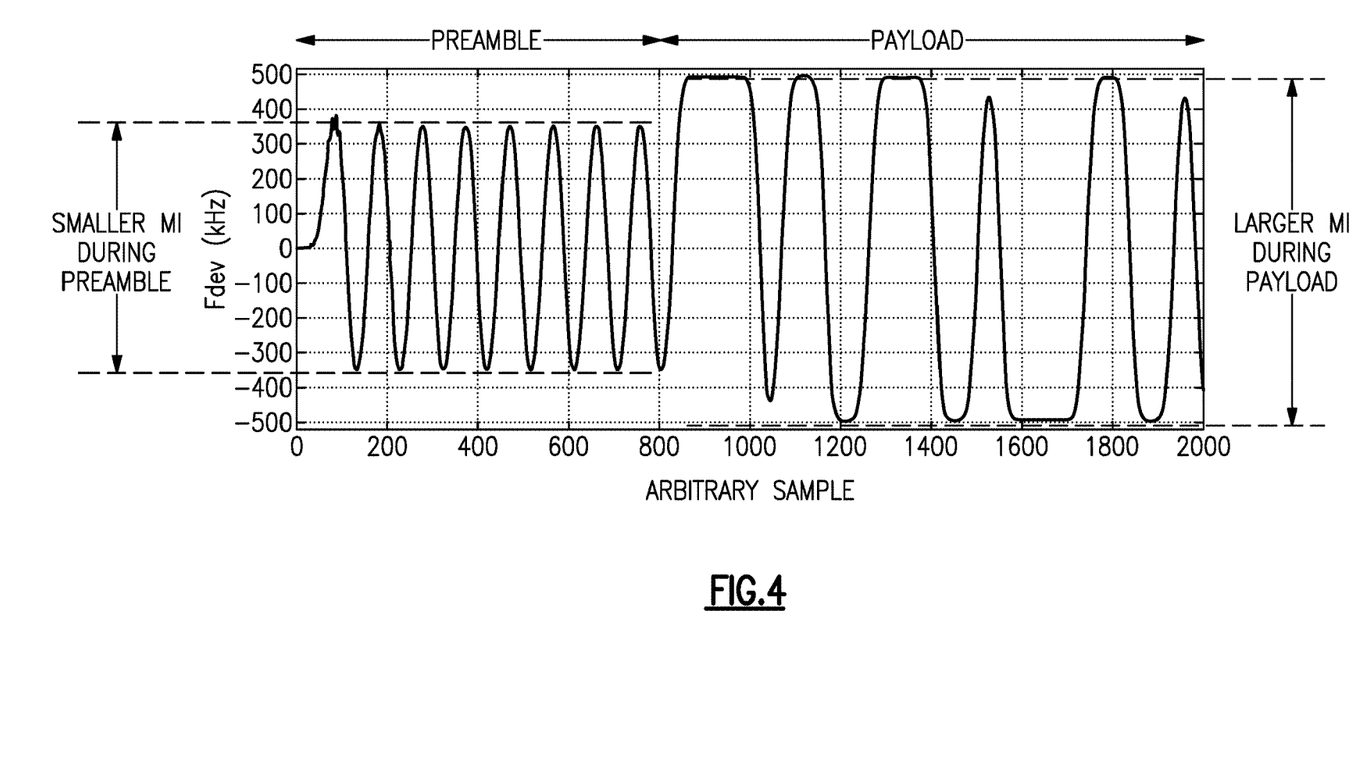
FIG. 4 is waveform of a frequency shift-keying signal in accordance with an embodiment.

FIG. 4 is waveform of a frequency shift-keying signal in accordance with an embodiment. The waveform of FIG. 4 corresponds to a signal transmitted by the transmit device 20 of FIG. 1 and received by the receive device 30 of FIG. 1 or the receive device 60 of FIG. 2. This waveform shows that the FSK signal has a smaller magnitude modulation index for a preamble and a larger magnitude modulation index for the remainder of the packet. A receive device can measure frequency error (e.g., frequency offset) and make a one-shot adjustment while processing the preamble.

Figure 5:
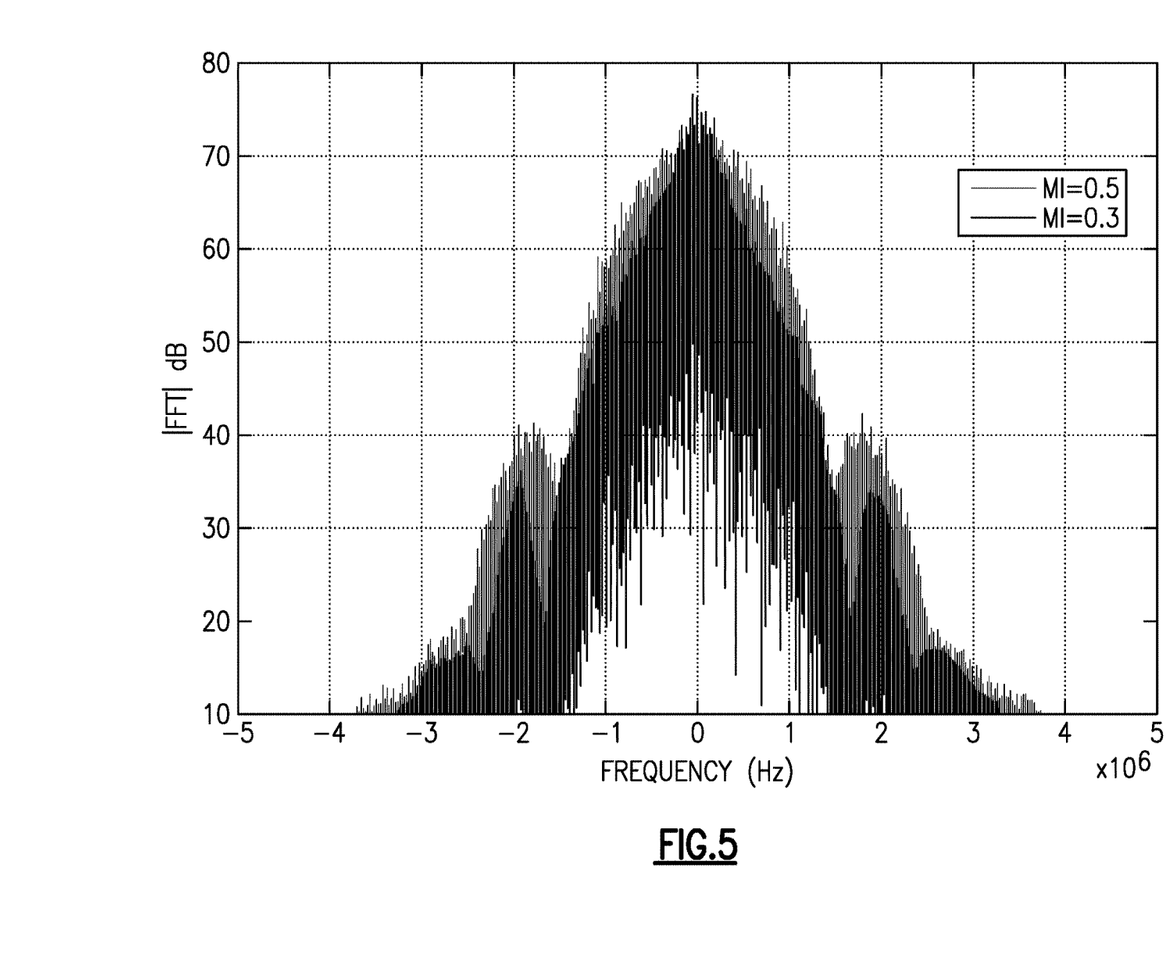
FIG. 5 shows spectral plots for different modulation index values.

FIG. 5 shows spectral plots for different modulation index values. This figure shows that for a smaller magnitude of a modulation index, less bandwidth is used. For instance, less bandwidth is used when the modulation index is 0.3 compared to when the modulation index is 0.5. Accordingly, reducing the magnitude of the modulation index of a preamble will reduce bandwidth of a signal being filtered by a channelization filter of a receive device. The modulation index of 0.3 can be for a preamble of a packet and the modulation index of 0.5 can be for the remainder of the packet (including the payload) in accordance with the principles and advantages discussed herein.

Figure 6:
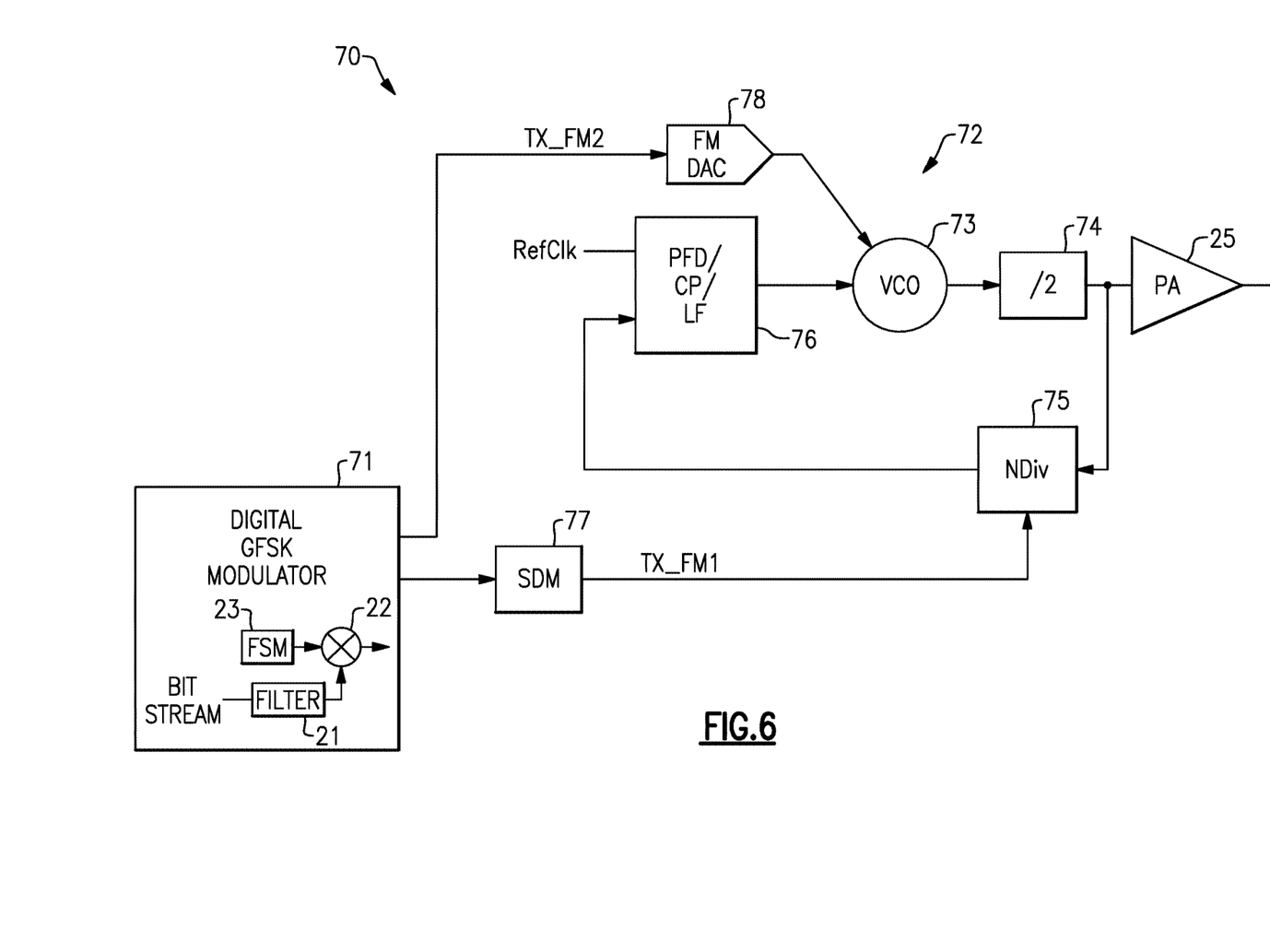
FIG. 6 is a schematic diagram of a transmit signal chain according to an embodiment.

FIG. 6 is a schematic diagram of a transmit signal chain 70 according to an embodiment. In the transmit signal chain 70, the transmitter takes on the form of a frequency synthesizer with digital control ports allowing instantaneous frequency modulation. Frequency control words can be received from a digital baseband processor. Carrier frequency adjustment and modulation are performed via the frequency synthesizer. Output signal generation and power control can be performed via the power amplifier.

The transmit signal chain 70 includes a digital GFSK modulator 71, a PLL 72, and a power amplifier. The PLL 72 is a frequency synthesizer. The PLL 72 includes a voltage-controller oscillator 73, a divider 74, a feedback divider 75, and a phase frequency detector/charge pump/loop filter circuit 76.

Carrier frequency adjustment and low frequency modulation can be accomplished using a first control word TX_FM1. A sigma delta modulator 77 can generate the first control word TX_FM1 based on an output of the GFSK modulator 71. The first control word TX_FM1 can dynamically adjust a division ratio in a feedback loop of the PLL 72. In particular, the first control word TX_FM1 can adjust a division ratio of the feedback divider 75. The transfer function of the frequency modulation at this injection point can take on a low-pass form, with the bandwidth being defined by the PLL's loop bandwidth.

A digital-to-analog converter (DAC), such as a frequency modulated (FM) DAC 78, can modulate the PLL's carrier frequency via a second control word TX_FM2 to provide for high frequency modulation. The FM DAC 78 can convert the second control word TX_FM2 to an analog signal and apply the analog signal to the voltage-controlled oscillator 73 of the PLL 72. The transfer function of this injection point can take on a high-pass form, with the cut-off determined by the PLL's loop bandwidth.

The GFSK modulator 71 can scale the first control word TX_FM1 and/or the first control word TX_FM2 to adjust modulation index in accordance with the principles and advantages discussed herein. A multiplier 22 of the GFSK modulation 71 can be used in the scaling. As illustrated, the GFSK modulator 71 can include a Gaussian filter 21, the multiplier 22, and a finite state machine 23 arranged to control the multiplier 22 to cause modulation index to be adjusted in accordance with any suitable principles and advantages discussed herein.

The power amplifier 25 can include multiple segments, each converting the PLL's output voltage waveform to a current. The output power of the power amplifier 25 can be set by adjusting the number of active power amplifier segments. An output matching circuit (not illustrated) can be coupled between an output of the power amplifier and an antenna.

Figure 7:
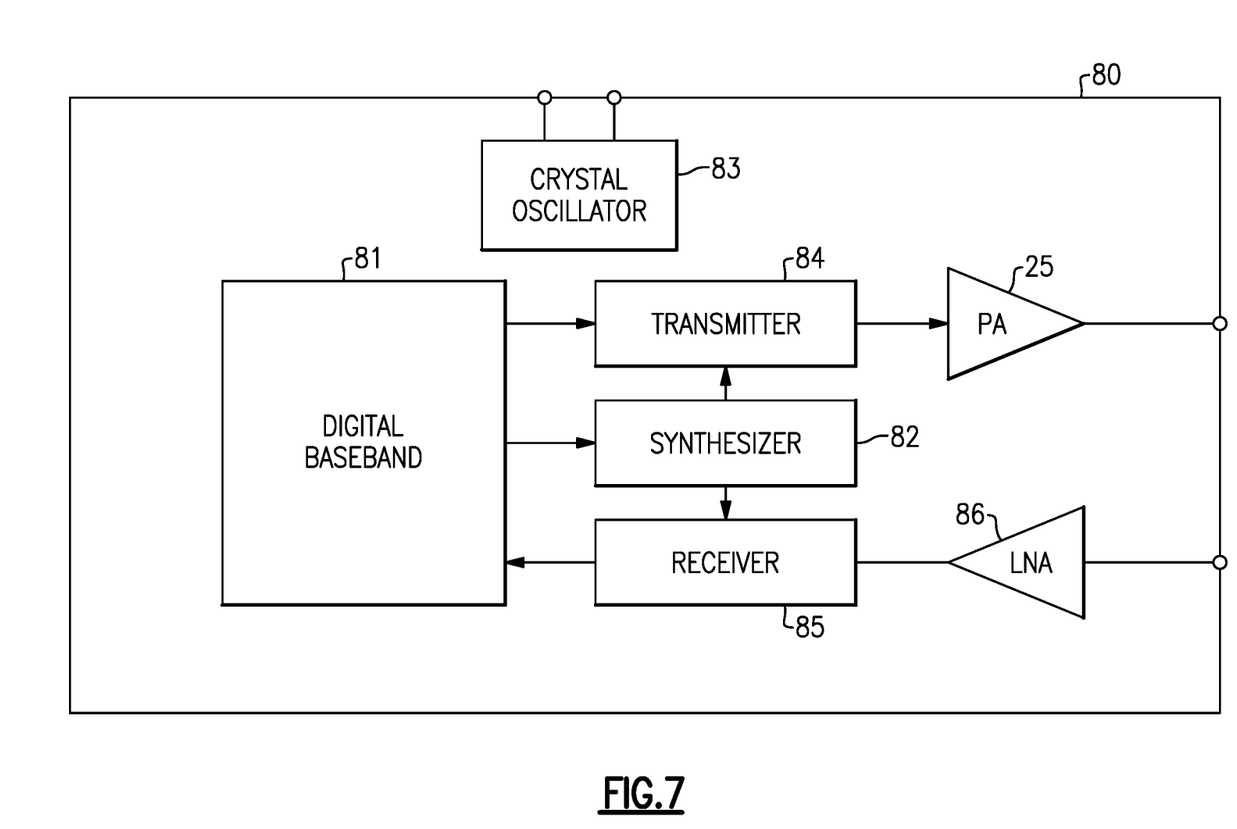
FIG. 7 is a schematic diagram of a transceiver integrated circuit according to an embodiment.

FIG. 7 is a schematic diagram of a transceiver integrated circuit 80 according to an embodiment. Any of the transmit devices and/or the receive devices discussed herein can be implemented on a transceiver integrated circuit. As illustrated, the transceiver integrated circuit 80 includes a digital baseband processor 81, a synthesizer 82, a crystal oscillator 83, a transmitter 84, a power amplifier 25, a receiver 85, and a low noise amplifier 86.

An analog RF FE can include the transmitter 84, the receiver 85, and the synthesizer 82. The transceiver 80 can operate in a half-duplex fashion so that the synthesizer 82 can serve the dual purpose of generating local oscillator signals for both the receiver 85 and the transmitter 84. In the transceiver integrated circuit 80, a receive chain can include the low noise amplifier 86, a receiver 85 that includes a heterodyne down-converter and filtering, and a data conversion stage in the baseband processor 81. In the transceiver integrated circuit 80, a transmitter chain can include a receiver 85 that includes a frequency agile synthesizer and the power amplifier 25. The illustrated crystal oscillator 83 is connected to an off-chip crystal. The radio channel frequency and symbol rate can be derived from an output of the crystal oscillator 83.

The digital baseband processor 81 can perform any suitable processing associated with generating signals for the transmitter 84 and/or processing signals provided by the receiver 85. The digital baseband processor 81 can provide digital modulation data to the transmitter 84. The digital baseband processor 81 can include any of the modulation circuits discussed herein, such as the digital GFSK modulator 71 of FIG. 6 or the modulation circuit of the transmit device 20 of FIG. 1. The digital baseband processor 81 can process baseband data from the receiver 85 to perform a variety of different processing, such as automatic gain control, synchronization, and data demodulation. The digital baseband processor 81 can dynamically provide configuration and/or control data to/from an RF FE that includes the transmitter 84 and the receiver 85. The digital baseband processor 81 can control system timing in the transceiver integrated circuit 80.

Any of the principles and advantages discussed herein can be applied to other systems, devices, integrated circuits, electronic apparatus, not just to the embodiments described above. The elements and operations of the various embodiments described above can be combined to provide further embodiments. The principles and advantages of the embodiments can be used in connection with any other systems, devices, integrated circuits, apparatus, or methods that could benefit from any of the teachings herein.

Aspects of this disclosure can be implemented in various electronic devices. Examples of the electronic devices can include, but are not limited to, consumer electronic products, parts of electronic products such as integrated circuits, electronic test equipment, wireless communication devices, personal area network communication devices, cellular communications infrastructure such as a base station, vehicular electronics such as automotive electronics, etc. Further, the electronic devices can include unfinished products.

Unless the context indicates otherwise, throughout the description and the claims, the words "comprise," "comprising," "include," "including," and the like are to generally be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural may also include the plural or singular, respectively. The word "or" in reference to a list of two or more items, is generally intended to encompass all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

While certain embodiments have been described, these embodiments have been presented by way of example only, and are not intended to limit the scope of the disclosure. Indeed, the novel methods, apparatus, systems, devices, and integrate circuits described herein may be embodied in a variety of other forms; furthermore, various omissions, substitutions and changes in the form of the methods, apparatus, and systems described herein may be made without departing from the spirit of the disclosure. For example, circuit blocks described herein may be deleted, moved, added, subdivided, combined, and/or modified. Each of these circuit blocks may be implemented in a variety of different ways. The accompanying claims and their equivalents are intended to cover any such forms or modifications as would fall within the scope and spirit of the disclosure.

What is claimed is:

1. A communication device with frequency-shift keying, the communication device comprising:
   a modulation circuit configured to modulate a digital input signal; and
   a frequency synthesizer configured to receive an output of the modulation circuit and to output a frequency-shift keying signal comprising a packet, wherein the packet comprises a preamble and an other portion;
   wherein the modulation circuit is configured to adjust modulation to cause the preamble to have a first modulation index and the other portion to have a second modulation index, and wherein the second modulation index has a greater magnitude than the first modulation index.

2. The communication device of claim 1, wherein the modulation circuit comprises a multiplier configured to adjust modulation of the digital input signal.

3. The communication device of claim 2, further comprising a finite state machine configured to control the multiplier.

4. The communication device of claim 1, wherein the first modulation index and the second modulation index have the same sign.

5. The communication device of claim 1, wherein the first modulation index is independent of information being transmitted by the packet.

6. The communication device of claim 1, wherein the frequency synthesizer comprises a phase-locked loop comprising a divider, and wherein the divider is configured to receive the output of the modulation circuit.

7. The communication device of claim 6, further comprising a sigma delta modulator coupled between the modulation circuit and the divider.

8. The communication device of claim 1, wherein the frequency synthesizer comprises a phase locked loop comprising a controllable oscillator, wherein the controllable oscillator is configured to receive the output of the modulation circuit.

9. The communication device of claim 8, further comprising a digital-to-analog converter coupled between the modulation circuit and the controllable oscillator, wherein the controllable oscillator comprises a voltage-controlled oscillator.

10. The communication device of claim 1, further comprising a power amplifier configured to amplify the frequency-shift keying signal.

11. The communication device of claim 1, further comprising a receiver that comprises a frequency correction circuit configured to perform frequency correction based on a preamble of a received packet received by the communication device.

12. A method of transmitting a packet using frequency-shift keying, the method comprising:
   generating a preamble of a packet such that the preamble has a first modulation index, wherein the packet is modulated with frequency-shift keying;
   generating a payload of the packet such that the payload has a second modulation index, wherein the second modulation index has a greater magnitude than the first modulation index, wherein the first and second modulation indexes each represent a frequency modulation; and
   transmitting the packet.

13. The method of claim 12, further comprising adjusting modulation index for the packet, using a multiplier, from the first modulation index to the second modulation index.

14. The method of claim 12, wherein the first modulation index and the second modulation index are both independent of the information being transmitted by the packet.

15. The method of claim 12, wherein the packet is modulated with Gaussian frequency-shift keying.

16. A method of processing a frequency-shift keying signal, the method comprising:
   receiving, by a receive signal path, a frequency-shift keying signal comprising a packet that comprises a preamble and a payload, wherein the preamble has a first modulation index that has a smaller magnitude than a second modulation index of the payload, and wherein a channelization filter has a passband associated with the second modulation index;
   performing frequency correction based on an output of the channelization filter associated with the preamble that has the first modulation index, wherein the channelization filter is in the receive signal path; and
   subsequent to said performing frequency correction, demodulating the payload that has the second modulation index.

17. The method of claim 16, further comprising measuring frequency error based on an output of a circuit that has an input coupled to the output of the channelization filter, and wherein said performing frequency correction is based on said measuring frequency error.

18. The method of claim 16, wherein the first and second modulation indexes each represent a respective frequency modulation.

19. The method of claim 16, wherein modulation index information is used in said performing frequency correction.

20. The method of claim 16, wherein the first modulation index is independent of information being transmitted by the packet.

* * * * *